United States Patent [19]

Whitehead et al.

[11] Patent Number: 4,670,817

[45] Date of Patent: Jun. 2, 1987

[54] HEAT SINK AND INTERCONNECTION ARRANGEMENT FOR SERIES CONNECTED POWER DIODES

[75] Inventors: Derek Whitehead, Locust Valley; Charles Lien, Huntington; Herman Walz, Commack; George C. Gallios, Setauket, all of N.Y.

[73] Assignee: Venus Scientific Inc., Farmingdale, N.Y.

[21] Appl. No.: 656,342

[22] Filed: Oct. 1, 1984

[51] Int. Cl.[4] .............................................. H05K 7/20
[52] U.S. Cl. .............................. 361/388; 174/16 HS; 363/141; 363/144
[58] Field of Search ................. 174/16 HS; 165/185, 165/80 B, 80 D; 357/81; 361/386–388; 363/141, 144

[56] References Cited

U.S. PATENT DOCUMENTS

| | | | |
|---|---|---|---|
| 3,435,891 | 4/1969 | Parrish | 363/141 |
| 4,015,184 | 3/1977 | Cooperman | 363/141 |
| 4,458,305 | 7/1984 | Buckle et al. | 363/141 |
| 4,506,320 | 3/1985 | Koroncai et al. | 363/141 |

FOREIGN PATENT DOCUMENTS

| | | | |
|---|---|---|---|
| 0033034 | 3/1977 | Japan | 363/144 |
| 0146136 | 12/1978 | Japan | 363/141 |

OTHER PUBLICATIONS

Arnold et al, "Module with Internal Elements for Reducing Thermal Resistance", IBM Technical Disclosure Bulletin, vol. 21, No. 4, 9/78, pp. 1473-1474.

Primary Examiner—A. D. Pellinen
Assistant Examiner—Gregory D. Thompson
Attorney, Agent, or Firm—Ostrolenk, Faber, Gerb & Soffen

[57] ABSTRACT

A metal base plate has two spaced thermally conductive ceramic bars fixed to one surface. The outwardly facing surface of the bars has spaced conductive pads. A plurality of diodes which are of alternating opposite polarity have axially extending leads extending between the bars in spaced parallel relationship with respect to one another, and are soldered to the conductive pads on the bars to define a series connection of the diodes. The suspended diodes and their leads are then encapsulated in a body of polymerizable material containing thermally conductive electrically insulative particles suspended therein such that the particles occupy more than about 75% of the encapsulating mass.

8 Claims, 7 Drawing Figures

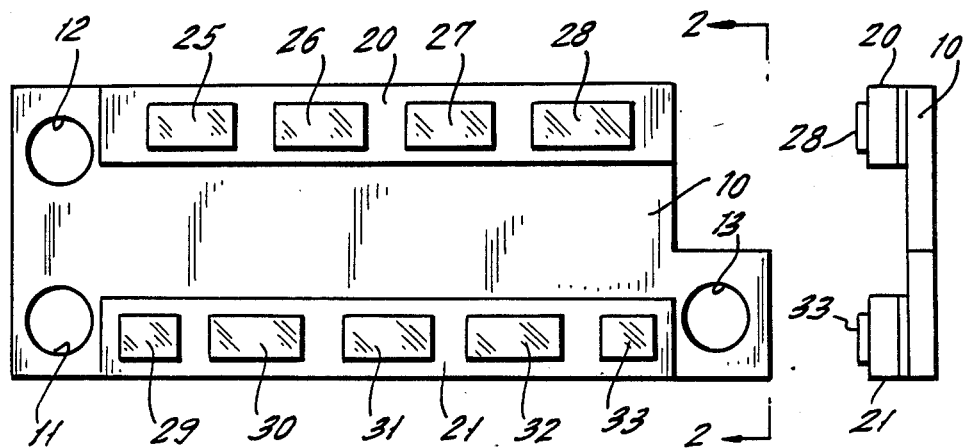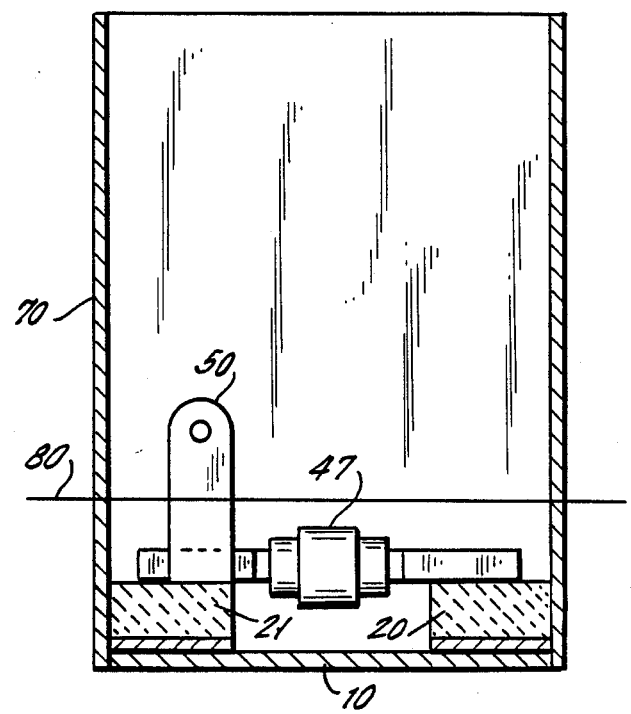

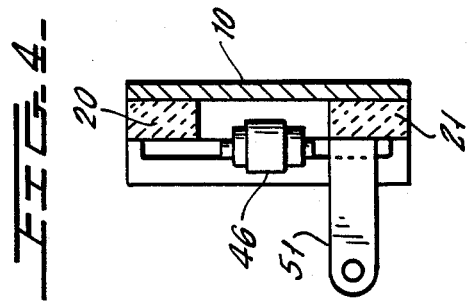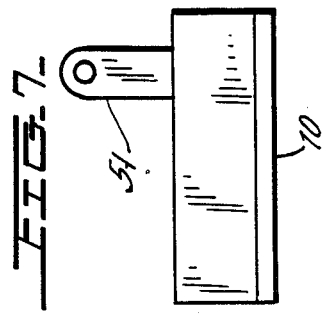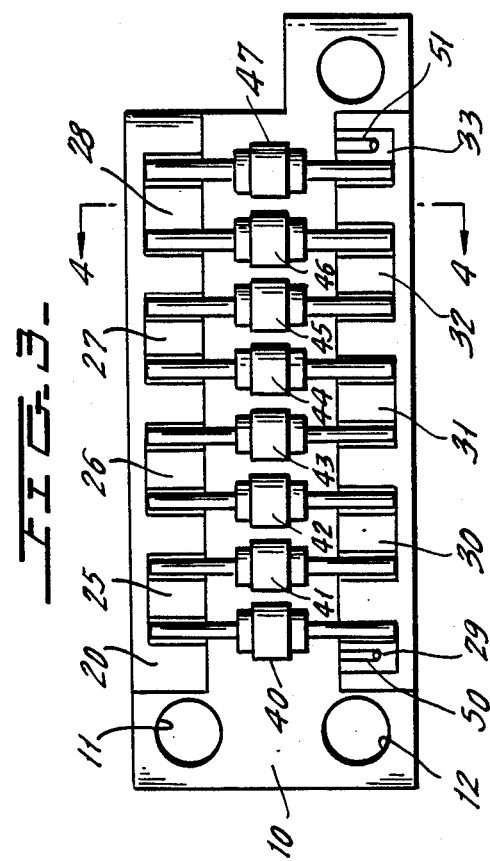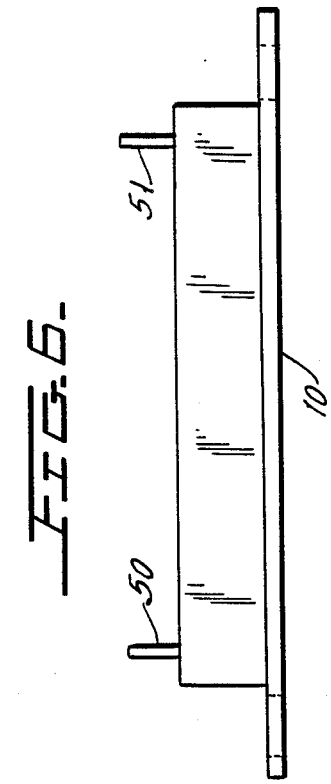

HEAT SINK AND INTERCONNECTION ARRANGEMENT FOR SERIES CONNECTED POWER DIODES

BACKGROUND OF THE INVENTION

This invention relates to encapsulated electrical assemblies and to a product which is formed thereby.

Encapsulated electrical assemblies are well known to the art, wherein a plurality of electrical components including, for example, series-connected diodes, are encapsulated in a thermally conductive mass. Present arrangements, however, do not permit sufficient cooling of a large number of semiconductor devices which are compactly contained within a given volume to define a high voltage assembly. In particular, present arrangements do not permit the use of known highly reliable semiconductors connected in series in a compact assembly while preserving the established reliability rating of the components. In order to accomplish this, it is necessary to provide a superior thermal path for junction cooling, while providing dielectric isolation for the high voltage applications. Thus, known techniques fail to produce a product capable of operation at base plate temperatures of 125° C. and do not use established reliability components. Those products which are operated at high temperatures and which use established reliability components are not capable of operation at high voltages with fast recovery times.

Among known techniques are those in which the silicon junctions are stacked in series to achieve the necessary high breakdown voltage. This produces an assembly with relatively poor temperature distribution characteristics since the thermal conductivity of silicon is relatively poor. Therefore, the central junctions or chips become relatively hot and tend to go into thermal avalanche. When the central chips go into thermal avalanche, the adjacent chips will also go into thermal avalanche and the entire assembly begins to fail. This failure mechanism is accelerated by the degradation of reverse recovery time with temperature which further degrades the junctions. Finally, the structure referred to above normally employs an enclosing polymer shell which has poor thermal conductivity to surrounding areas.

BRIEF DESCRIPTION OF THE INVENTION

In accordance with the present invention, a novel structure and method of manufacture thereof is provided which permits the manufacture of high voltage, fast recovery diode assemblies, which are capable of operation at base plate temperatures from 125°–150° C. at power levels greater than 1 watt. More specifically, in accordance with the invention, a conductive base plate has two spaced, parallel, thermally conductive ceramic bars soldered thereto. Each of the bars has spaced conductive solder pads on its surface. A plurality of diodes, which may be established reliability diodes, having axially extending leads, are then suspended between the ceramic bars in parallel spaced relation to one another and extend perpendicularly to the direction of elongation of the bars. The devices are mechanically arranged with alternate forward-conducting polarities to establish a series-connected string of diodes having the same electrical polarity, which defines a high-voltage assembly, when their leads are soldered to the appropriate solder pads of the ceramic bars. Note that alternate pairs of adjacent leads are connected to the same conductive pad so that the devices of these leads are automatically connected in series.

The base plate then serves as a base for a volume which receives an encapsulation fluid. The encapsulation fluid is also captured by the walls of a mold form which extends perpendicularly from the edges of the base plate. The encapsulation fluid consists of a polymerizable silicone which has good electrical insulation properties and which has suspended therein thermally conductive insulation particles such as particles of beryllium oxide having a size of from 24 to 80 mesh, randomly oriented.

Unpolymerized silicone is initially loaded with the thermally conductive ceramic particles and fills the volume which is enclosed above the base plate to which the diodes have been soldered. This fluid will enclose all of the exposed surfaces of all diodes which are suspended between the ceramic bars. The fluid is permitted to sit, and additional particles can be added to the fluid, so that the particles settle under the force of gravity such that they form from 75-98% of the volume enclosing the diodes and base plate. A polymerizing reaction is then allowed to proceed so that the suspended ceramic particles become entrapped in the polymerized silicone.

Thereafter, the polymerized silicone is cut at any desired level in a plane parallel to the plane of the base plate, with all electrical components effectively encapsulated in the high content ceramic insulating particles. A pair of end terminals may penetrate through the silicone to enable connection to the series-connected string of diodes which have been encapsulated.

While any type of electrical component can be encapsulated in the manner described above, preferably the invention employs JTX diodes which have been preselected for a desired $T_{rr}$ (diode reverse recovery time). The resulting assembly will be a high-voltage, fast-recovery rectifier string which can, for example, have a reverse voltage rating of from 3,000 to 20,000 volts, a forward current of from 1 to 20 amperes, a $T_{rr}$ less than about 70 nanoseconds and a $T_j$ of about 12° C. above base plate per watt dissipated. Obviously, any desired ceramic material can be used for the particles and for the ceramic bars and any desired polymerizable silicone can be employed for the fluid suspending medium. The base plate is preferably of a nickel-iron alloy such as kovar, but any other conductive materials can be used.

BRIEF DESCRIPTION OF THE DRAWINGS

FIG. 1 is a plan view of a base plate which has ceramic bars soldered thereto and shows the conductive solder pads on the ceramic bars.

FIG. 2 is a side view of FIG. 1 as seen from line 2—2 in FIG. 1.

FIG. 3 shows the arrangement of FIG. 1 after eight series-connected diodes have been soldered to the solder pads in series-circuit relationship.

FIG. 4 is a cross-sectional view of FIG. 3, taken across the section line 4—4 in FIG. 3.

FIG. 5 schematically illustrates the structure of FIG. 4 contained within a removable filling chimney for encapsulating the assembly.

FIG. 6 is an elevation view of the assembly of FIGS. 3 and 4 after the encapsulating mass has been cut to size.

FIG. 7 is a side view of FIG. 6.

DETAILED DESCRIPTION OF THE DRAWINGS

Referring first to FIGS. 1 and 2, there is shown therein a conductive base plate 10 which can be of any desired conductive material, preferably kovar, which is selected for a temperature expansion coefficient characteristic which matches that of ceramic bars which are later used. The kovar base 10 has mounting openings 11, 12 and 13 (FIGS. 1 and 3) which are asymmetrically arranged so as to provide a polarity indicator for the assembly. In a typical device which employs, for example, eight "high rel" diodes connected in series, the kovar base can have a length of about 2 inches, a width of about ¾ inch and a thickness of about 0.030 inch. The base is first copper plated, then nickel plated, and then tin plated.

Two thermally conductive, electrically insulative rectangular bars 20 and 21 are secured to the opposite edges of the base plate 10. While bars 20 and 21 can be of any desired ceramic material, they are in a preferred embodiment made of alumina having a thickness of about 0.09 inch, a length of about 1.49 inches and a width of about 0.19 inch. The rear surface of the bars may be fully metallized so that the bars can be soldered to the base plate 10 by any suitable soft solder.

Selective upper portions of each of bars 20 and 21 contain metallizing which serves as solder pads for the devices to be connected in circuit arrangement with respect to one another. Thus, conductive solder pads 25, 26, 27 and 28 are formed on the upper surface of bar 20, while solder pads 29, 30, 31, 32 and 33 are formed on the upper surface of bar 21. Note that the pads are aligned with one another so that projections of their edges overlap, whereby electrical conductors disposed perpendicularly to the bars 20 and 21 can be soldered to alternate ones of the contact pads. By way of example, each of the pads can be spaced from an adjacent pad by about 0.10 inch. Each of pads 25 to 28 and 30 to 32 can have a length of about 0.250 inch. The end pads 29 and 33 will have a smaller length of about 0.050 inch.

After the bars 20 and 21 have been secured to the base plate 10, a plurality of diodes, for example, eight diodes in FIG. 3, which are high-reliability diodes known as JTX diodes, selected for an appropriate $T_{rr}$, are mounted on and suspended across the ceramic bars 20 and 21. A soft solder is employed to solder the axial leads to appropriate respective pad. Thus, in FIG. 3, diodes 41-47 are soldered to the pads as shown. For example, diode 41 is soldered between pads 25 and 30, while diode 45 is soldered between pads 27 and 32. The diodes have the polarity schematically illustrated in that each adjacent diode has an opposite forward conduction direction. Consequently, a string of series-connected diodes exists, starting from pad 29 through the diodes, to the last pad 33.

Since pads 29 and 33 serve as terminal pads, suitable terminal lugs 50 and 51 are soldered to pads 29 and 33 respectively. Lugs 50 and 51 may be of copper, having a thickness of about 0.032 inch, a width of about 0.12 inch and a height of about 0.40 inch.

It should be specifically noted, particularly in FIG. 4, that the diodes 41-47 have an outer diameter sufficiently small to leave a substantial gap between the largest diameter of the diode and the metal base plate 10. Also note that the adjacent leads of the diodes at adjacent pads in FIG. 3 are sufficiently spaced from one another to provide the necessary dielectric insulation between the two leads under reverse-voltage conditions. By way of example, with the dimensions given, adjacent leads will be spaced by 0.10 inch.

In order to ensure the dielectric integrity of the assembly, a novel method is provided for encapsulating the assembly with a thermally conductive insulation medium. This process ensures excellent thermal conduction to the base plate 10 such that the temperature rise of components within the completed housing is no greater than about 12° C. higher than the temperature of the base plate 10.

In accordance with this aspect of the invention, and as shown in FIG. 5, a chimney or hollow cylindrical enclosure 70 encloses the base plate 10 and extends vertically above the base plate for a distance of about four times the height of the housing to be produced. A polymerizable fluid loaded with thermally conductive electrically insulated particles is then poured into the volume 70. The fluid is permitted to settle so that the particles will tend to compact under the force of gravity around the diodes 40-47 such that, to the height identified by the line 80, the particles will occupy from 75% to 98% of the encapsulating volume. Particles can be added during the settling process. Thereafter, the polymerizable fluid is polymerized to freeze or fix the particles in place, closely surrounding the diodes and their leads and defining an excellent thermal conductive path from the diodes to the base plate 10.

While a wide variety of particles and polymerizable fluids can be used with different sedimentation rates, particularly good results have been obtained when using a beryllium oxide powder in a silicone prepolymer. Approximately 80% to 90% by volume of beryllium oxide powder is initially loaded into the silicone prepolymer. The volume is permitted to settle for from 1 to 4 hours, depending on the prepolymer viscosity, to permit the concentration of particles toward the bottom region of the volume 70. With this arrangement, the stoichiometry is such that the polymerization reaction will proceed when a percentage greater than 75% by weight of the beryllium oxide particles become entrapped by the polymerized silicone.

Prototype assemblies employing the novel process and structure described above have been tested over a temperature range of from −55° C. to +125° C. at 1 ampere forward current and 3,000 volts peak inverse voltage. Diode junction temperatures were found to be about 137° C. which was about 12° C. higher than the base plate 10 temperature.

Since the present invention minimizes temperature rise and thus an increase in reverse recovery time, the invention facilitates the use of presently available fast recovery diodes for relatively high temperature applications. The application of Poiseuille's Law to select the particle size of the thermally conductive ceramic filler and the stoichiometry of the prepolymer and selected catalysts to control gelation times also permit the requisite precipitation of the the thermally conductive ceramics.

In a first example of the invention, a cycloaliphatic epoxide resin was loaded with thermally conductive ceramic particles and a hexahydropthalic anhydride catalyst, modified with dimer acids. The amount of catalyst determines the rate of gellation. The fluid was heated to 100° C. to reduce its viscosity to about 300 centipoise and was permitted to settle for about one hour. This was followed by a gellation time of about 4 hours at 100° C. The resulting product is rigid and has a fairly high dielectric constant.

In a second example, a methyl-phenol silicone polymer was loaded with ceramic powder and a dibutyl tin diluarate catalyst was used. The polymer had a viscosity of about 1,000 centipoise and was allowed 72 hours to settle and cool. The polymer was deliberately dessicated to insure a longer gellation time, in the order of 20 hours. The resulting product is rubbery in nature and flexible and has a relatively low dielectric constant.

Many other polymers and catalysts or polymers alone could have been selected, with appropriate modifications of settling and gellation times to provide any desired rigidity, thermal withstandability and dielectric constant.

While any desired particle size can be employed, particle sizes to be employed for the ceramic particles are preferably a randomly ordered mixture of 24 to 80 mesh which has been found to permit the highest possible packing density.

"Mesh" refers to the well known standard for defining particle sizes. See, for example, the definition for "mesh" or "mesh size" in McGraw-Hill's "Dictionary of Scientific and Technical Terms".

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A high voltage rectifier assembly comprising:

a metallic base plate having a flat mounting surface;

first and second spaced, parallel and coextensive elongated bars of thermally conductive, electrically insulative ceramic material having one surface fixed to said flat mounting surface, and respective pluralities of spaced conductive solder pads on a free surface opposite said one surface of each of said bars;

a plurality of diodes each of which contains a rectifying junction and a pair of axially aligned conductive leads extending from respective sides of said rectifying junction; each of said diodes being disposed in parallel, spaced relation to one another and disposed perpendicularly to the length of said ceramic bars and being symmetrically spaced from one another; each of said diodes having a forward conduction direction which is opposite to those of diodes which are adjacent thereto; said axially aligned conductive leads of each of said diodes being electrically connected to respective ones of said solder pads on said bars to electrically connect each of said diodes in series with one another so that the same current flows in all diodes, whereby said thermally conductive bars are effective to enable each one of said series connected plurality of diodes to operate at its rated electrical levels.

2. The assembly of claim 1 which further includes an encapsulating mass of electrically insulative, thermally conductive particles fixed within a polymerizable mass; said encapsulating mass encapsulating said diodes and said free surface and said one surface of each one of said bars and the exposed mounting surface of said base plate; said first and second terminals extending outside of said encapsulating mass.

3. The assembly of claim 2, wherein said encapsulating mass particles are distributed in size over the range of about 24 to about 80 mesh.

4. The assembly of claim 2, wherein said particles constitute from 75 to 98% of the volume of said encapsulating mass.

5. The assembly of claim 3, wherein said particles constitute from 75 to 98% of the volume of said encapsulating mass.

6. The assembly of claim 1, wherein said base plate consists of an iron alloy.

7. The assembly of claim 1, wherein said diodes are fast recovery, high-rel diodes.

8. The assembly of claim 1, wherein said ceramic bars are flat and rectangular in cross-section.

* * * * *